United States Patent [19]

Dünnebacke

[11] Patent Number: 5,332,976
[45] Date of Patent: Jul. 26, 1994

[54] SOUND SIGNAL AMPLIFIER WITH LOW POWER DISSIPATION

[75] Inventor: Joachim Dünnebacke, Herborn, Fed. Rep. of Germany

[73] Assignee: U.S. Philips Corporation, New York, N.Y.

[21] Appl. No.: 10,230

[22] Filed: Jan. 28, 1993

[30] Foreign Application Priority Data

Feb. 6, 1992 [DE] Fed. Rep. of Germany ....... 4203353

[51] Int. Cl.$^5$ .............................................. H03F 3/68
[52] U.S. Cl. ................................. 330/124 R; 381/28
[58] Field of Search ............... 330/51, 124 R; 381/28, 381/120, 121

[56] References Cited

U.S. PATENT DOCUMENTS

| | | | |
|---|---|---|---|
| 3,542,953 | 8/1967 | Munch | 381/120 |
| 4,321,428 | 3/1982 | Seke | 381/120 |
| 4,441,086 | 4/1984 | Karlow | 330/295 |
| 4,528,686 | 7/1985 | Dressler | 381/28 |
| 4,827,221 | 5/1989 | Botti et al. | 330/51 |

FOREIGN PATENT DOCUMENTS 63-272208  11/1988  Japan.

Primary Examiner—Steven Mottola
Assistant Examiner—Tiep Nguyen
Attorney, Agent, or Firm—Bernard Franzblau

[57] ABSTRACT

An amplifier for sound signals is made up of an even number of power amplifiers each of which have each an output, wherein each amplifier output can be switched to a first terminal of an associated loudspeaker and in which the second terminals of the loudspeakers can be switched to an output of a buffer amplifier. In order to minimize power losses, the buffer amplifier supplies at its output a DC voltage which is about half the value of the supply voltage of the power amplifiers. In addition, half the power amplifiers supply an output signal that is inverted relative to their input signal.

9 Claims, 1 Drawing Sheet

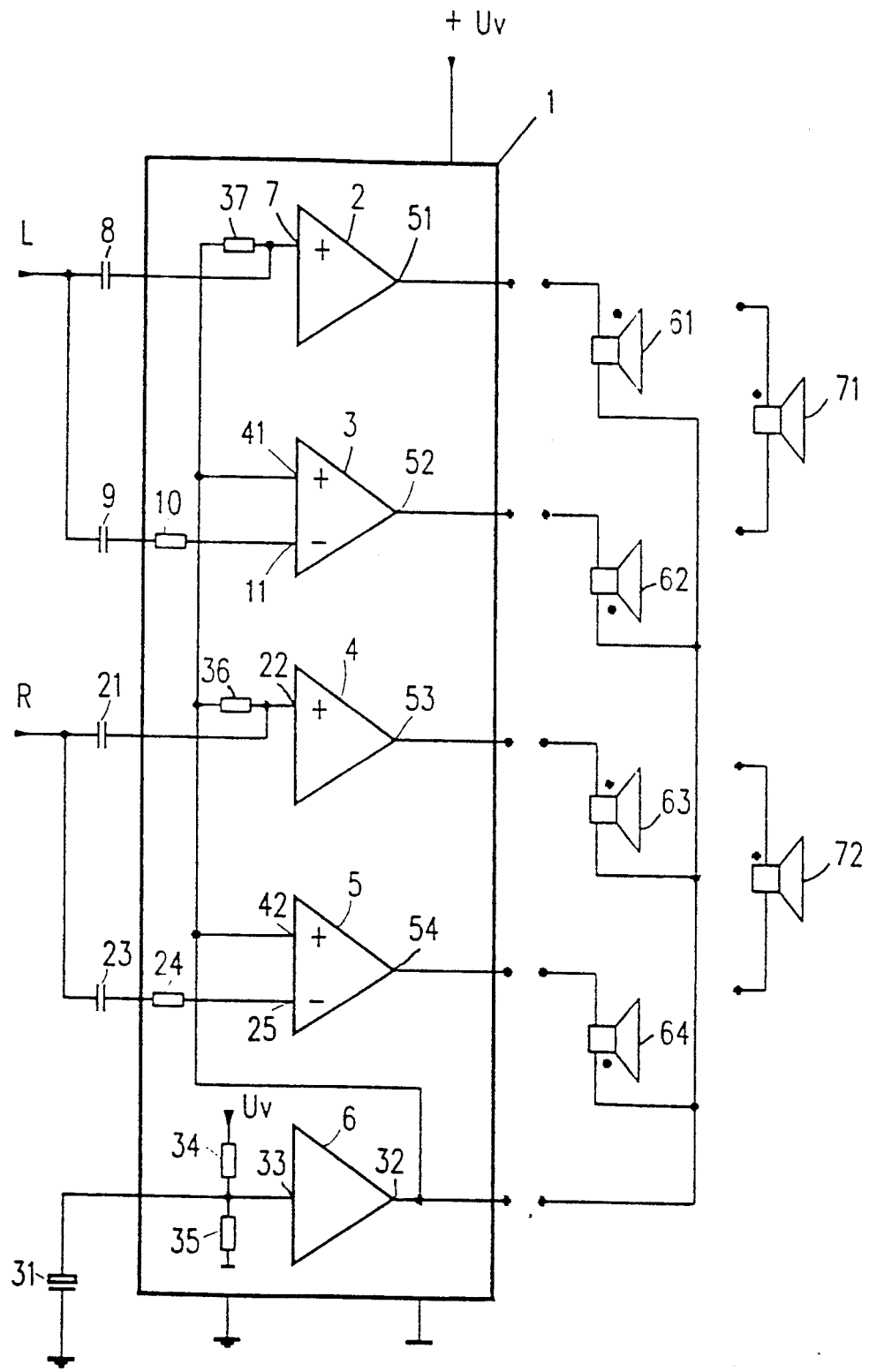

5,332,976

SOUND SIGNAL AMPLIFIER WITH LOW POWER DISSIPATION

BACKGROUND OF THE INVENTION

This invention relates to an amplifier for sound signals, comprising an even number of power amplifiers each of which have an output, in which each amplifier output can be switched to a first terminal of an associated loudspeaker and in which second terminals of the loudspeakers can be switched to the output of a buffer amplifier.

An amplifier of this type comprising two power amplifiers is known from Japanese Patent Application JP-A-63/272208. In that Application the outputs of two power amplifiers collectively feed an output of a buffer amplifier each via one loudspeaker. This circuit arrangement is disadvantageous in that the currents flow through the two loudspeakers in the same direction so that the buffer amplifier passes the sum of the currents.

SUMMARY OF THE INVENTION

It is an object of the invention to provide an amplifier circuit which operates with less power dissipation.

According to the invention this object is achieved in that the buffer amplifier supplies at its output a DC voltage which is about half the value of the supply voltage of the power amplifier and in that half of the power amplifiers supply an output signal that is inverted relative to their input signal.

This structure of the power amplifiers allows two power amplifiers to supply each time an output signal of opposite polarity, so that the difference between the currents in lieu of the sum of the currents flows through the buffer amplifier. If the signals passing through the two power amplifiers are equal, for example, because the two amplifiers are connected to the same sound channel, the currents are cancelled out and no current will flow through the buffer amplifier. Even if the two corresponding amplifiers are connected to different sound channels, the power flowing through the buffer amplifier will generally be small because the information of, for example, the two sound channels of a stereo sound signal are often very similar or largely identical. For the currents flowing through the loudspeaker thus to be cancelled out or substantially cancelled out, the DC voltage supplied by the buffer amplifier at its output should correspond to half the value of the supply voltage of the power amplifiers.

A further requirement is obviously that the individual power amplifiers have equal power gain, although some power amplifiers operate in inverting fashion and others in non-inverting fashion. The number of power amplifiers operating in inverting and in non-inverting fashion is the same.

This arrangement of the power amplifiers or power amplifier respectively, as a whole provides the advantage that only a very small current flows through the buffer amplifier, which in many cases is a zero current. In this manner the power dissipation of the amplifier is distinctly reduced.

Especially in vehicle-based applications for car radios, a stereo sound signal is often to be amplified over four amplifier stages each followed by a loudspeaker. Especially for such an application there is ensured according to an advantageous embodiment that each sound channel has assigned thereto an inverting and a non-inverting power amplifier.

In this configuration, the currents of two power amplifiers, i.e. the currents flowing through the associated loudspeakers, are cancelled out. An inverting and a non-inverting power amplifier is provided per sound channel, which amplifiers produce the same output signal, but of opposite polarity. In this way the sum of the signals passing through the loudspeakers is equal to zero so that no current flows through the buffer amplifier. Since this applies to both sound channels, no or substantially no current will flow through the buffer amplifier, so that no power dissipation will occur there either.

BRIEF DESCRIPTION OF THE DRAWING

An exemplary embodiment of the invention will be further explained with reference to the accompanying drawing.

The sole drawing gives the diagrammatic representation of an amplifier 1 which comprises four power amplifiers 2, 3, 4 and 5. Furthermore, a buffer amplifier 6 is provided. A supply voltage $U_v$ is applied to the amplifier from the outside.

The amplifier 1 is provided for amplifying a stereo sound signal fed from the outside. In the representation shown in the drawing a sound signal is referenced L and the other sound signal is referenced R. L denotes the left sound channel and R denotes the right sound channel.

In the exemplary embodiment shown in the drawing the two power amplifiers 2 and 3 are provided for amplifying the sound signal L. For minimizing the power dissipation this sound signal L is applied to a non-inverting input of the power amplifier 2, while a switching capacitor 8 is inserted externally. The sound signal L is further applied to an inverting input 11 of the power amplifier 3 via a switching capacitor 9 and a matching resistor 10.

Accordingly, the sound signal of the other channel R reaches a non-inverting input 22 of the power amplifier 4 via a switching capacitor 21 and an inverting input 25 of the power amplifier 5 via a switching capacitor 23 and a resistor 24.

On its input side the buffer amplifier 6 is connected to ground via a capacitor 31. AC voltages occurring at an output 32 of the buffer amplifier 6 can be derived across this capacitor 31. The input 33 of the buffer amplifier 6 is further connected to the positive supply voltage $U_v$ through a resistor 34. The input 33 is further connected to ground potential through a further resistor 35. The values of the resistors 34 and 35 are identical so that the amplifier 6 supplies on its output 32 a DC voltage which is half the value of the supply voltage $U_v$.

The DC voltage occurring at the output 32 of the buffer amplifier 6 is applied to the non-inverting inputs 7 and 22 of the power amplifiers 2 and 4 respectively, each through respective resistors 37 and 36.

The power amplifiers 3 and 5 operate in an inverting fashion relative to the sound signals and each have a non-inverting input 41 and 42, respectively. The DC voltage signal from the output 32 of the buffer amplifier 6 is also applied to these inputs 41 and 42.

The power amplifier 2 supplies at its output 51 the received sound signal L in an amplified, non-inverted version. The power amplifier 3 supplies at its output 52 the same sound signal L in an equally amplified, but inverted version. Accordingly, the power amplifier 4 supplies at its output 53 the sound signal R in a non-inverted version and the power amplifier 5 at its output 54 the sound signal R in an inverted version. To the output 51 of the power amplifier 2 a loudspeaker 61 can be connected, which is connected with its first terminal to this output 51 and with its second terminal to the output 32 of the buffer amplifier 6. Accordingly, a further loudspeaker 62 is provided which can be connected with its first terminal to the output 52 of the power amplifier 3 and with its second terminal also to the output 32 of the buffer amplifier 6.

An identical structure is provided for the fight sound channel, two loudspeakers 63 and 64, respectively, are connected with their first terminals to the outputs 53 and 54, respectively, of the power amplifiers 4 and 5 and with the second terminals to the output 32 of the buffer amplifier 6.

Equal currents flow through loudspeaker 62 and loudspeaker 61, but the currents have opposite polarity so that these currents are cancelled out at the second terminals or at the junction at the output 32 of the buffer amplifier 6. The same holds true for the currents flowing through the loudspeakers 63 and 64 which have the same magnitude, but have opposite directions and are also cancelled out by their being combined at the output 32 of the buffer amplifier 6. The result is little power dissipation.

For acoustical reasons it can be taken into account that the currents pass through the two loudspeakers of one sound channel in opposite directions so that, depending on the structure of the loudspeaker, for example, in a vehicle the two loudspeakers can be reversely poled. In the drawing this is indicated by the dots near the terminals of the loudspeakers.

Also in the case where the power amplifiers 2, 3 and 4, 5 respectively, have slightly different gain factors, or where the loudspeakers 61, 62 and 63, 64, respectively, have different values, the current dissipated by the buffer amplifier 6 is relatively small.

The amplifier 1 shown in the drawing is also suitable for feeding no more than two loudspeakers as a bridge amplifier. In the drawing this is denoted by the loudspeakers 71, 72, one for each of the sound channels. If the amplifier 1 is to be used as a bridge amplifier, the loudspeaker 71 will be connected with its terminals to the outputs 51 and 52 of the power amplifiers 2 and 3. The amplifiers 2 and 3 then operate as bridge amplifiers. Accordingly, the loudspeaker 72 can be connected to the outputs 53 and 54 of the power amplifiers 4 and 5.

I claim:

1. An amplifier for sound signals comprising: an even number of power amplifiers each of which has an output, wherein each power amplifier output can be switched to a first terminal of an associated loudspeaker and in which second terminals of the loudspeakers can be switched to an output of a buffer amplifier, wherein the buffer amplifier supplies at its output a DC voltage which is about half the value of a supply voltage of the power amplifiers, and half the number of the power amplifiers supply output signals that are inverted relative to their input signals and other half the number of the power amplifiers supply output signals that are non-inverted relative to their input signals.

2. An amplifier as claimed in claim 1 for a stereo sound signal, characterized in that an inverting and a non-inverting power amplifier is assigned to each sound signal.

3. An audio amplifier circuit comprising:
   an even number of power amplifiers, each of which has an input which receives an audio input signal and an output coupled to a first terminal of a respective associated loudspeaker,
   a buffer amplifier which supplies at its output a DC voltage which is about half the voltage level of a DC supply voltage for the power amplifiers,
   means coupling respective second terminals of the loudspeakers in common to the output of the buffer amplifier, and wherein
   one half the number of the power amplifiers, each of which supplies to its respective associated loudspeaker an output signal that is inverted relative to its audio input signal; and other half the number of the power amplifiers, each of which supplies to its respective associated loudspeaker an output signal that is non-inverted relative to its audio input signal, whereby currents supplied to the output of the buffer amplifier via said loudspeakers substantially compensate one another.

4. An audio amplifier circuit as claimed in claim 3 wherein each audio input signal is applied to an inverting input of one of said one half the number of the power amplifiers and to a non-inverting input of one of said other half the number of the power amplifiers.

5. An audio amplifier circuit as claimed in claim 3 further comprising:
   means coupling said output of the buffer amplifier to corresponding inputs of the power amplifiers.

6. An audio amplifier circuit as claimed in claim 5 wherein said coupling means couples the output of the buffer amplifier directly to inputs of the inverting amplifiers and to said inputs of the non-inverting amplifiers via respective resistors.

7. An audio amplifier circuit as claimed in claim 5 further comprising:
   a voltage divider coupled to terminals of the DC supply voltage, and wherein a node in the voltage divider is coupled to an input of the buffer amplifier.

8. An audio amplifier circuit as claimed in claim 7 wherein said node of the voltage divider is coupled to a point of reference voltage via a capacitor.

9. An audio amplifier circuit as claimed in claim 3 wherein a gain of each of the inverting power amplifiers is equal to a gain of a respective one of the non-inverting power amplifiers.

* * * * *